United States Patent [19]
Rai

[11] Patent Number: 5,447,886
[45] Date of Patent: Sep. 5, 1995

[54] METHOD FOR MOUNTING SEMICONDUCTOR CHIP ON CIRCUIT BOARD

[75] Inventor: Akiteru Rai, Nara, Japan

[73] Assignee: Sharp Kabushiki Kaisha, Osaka, Japan

[21] Appl. No.: 191,923

[22] Filed: Feb. 4, 1994

[30] Foreign Application Priority Data

Feb. 18, 1993 [JP] Japan ................................ 5-29046

[51] Int. Cl.⁶ ........................................... H01L 21/44
[52] U.S. Cl. .................... 437/183; 437/209; 437/246; 257/737; 257/738; 257/779
[58] Field of Search ................ 437/209, 183, 246; 257/737, 738, 779

[56] References Cited

U.S. PATENT DOCUMENTS

| | | | |
|---|---|---|---|
| 3,798,762 | 3/1974 | Harris et al. | 29/626 |
| 3,905,038 | 9/1975 | Beyerlein | 357/70 |
| 4,017,963 | 4/1977 | Beyerlein | 437/182 |
| 4,747,209 | 3/1988 | Schaeffer et al. | 29/741 |

FOREIGN PATENT DOCUMENTS

| | | | |
|---|---|---|---|
| 51-2382 | 1/1976 | Japan . | |
| 9188155 | 10/1984 | Japan | 257/738 |
| 0004051 | 1/1989 | Japan | 437/183 |
| 3270030 | 12/1991 | Japan | 257/779 |
| 4037137 | 2/1992 | Japan | 437/183 |
| 4137541 | 5/1992 | Japan | 437/183 |
| 4180232 | 6/1992 | Japan | 437/183 |

*Primary Examiner*—Olik Chaudhuri
*Assistant Examiner*—Long Pham

[57] ABSTRACT

In mounting a semiconductor chip on a circuit board by a flip chip bonding method, an improved mounting method holds the circuit with a warp prevention device, on which the semiconductor chip is placed, while the circuit board is treated with heat for the reflow of the solder bumps. As a result, the circuit board is prevented from warping when heated at a temperature at which the solder bumps melt.

14 Claims, 7 Drawing Sheets

METHOD FOR MOUNTING SEMICONDUCTOR CHIP ON CIRCUIT BOARD

BACKGROUND OF THE INVENTION

1. Field of the Invention

The present invention relates to a semiconductor chip mounting method and apparatus for mounting a semiconductor chip on a circuit board using a flip chip bonding technique, and more particularly to a method and apparatus for preventing the circuit board from warping when heated in a solder reflow process.

2. Description of the Prior Art

In recent years, there has been a growing trend that semiconductor devices have an increased number of connection terminals according as the semiconductor devices are made finer. The wire bonding method conventionally used for terminal connection in the semiconductor chip mounting process cannot cope with such an increased number of connection terminals satisfactorily, and the flip chip bonding method, a wireless bonding method, is gaining popularity instead as a new terminal connection method.

In the flip chip bonding method, bump electrodes (solder bumps) are formed at external connection electrode portions of a semiconductor chip (flip chip) and subsequently the bump electrodes are bonded onto a circuit board by a face-down bonding technique.

FIG. 10 shows a typical semiconductor chip mounting process using the flip chip bonding.

First, flux 7 is applied onto a circuit board 2 in a manner as shown in FIG. 10 (a). Then a semiconductor chip 1 having a plurality of solder bumps 3 on its face is placed on the circuit board with the solder bumps 3 being opposed to bonding pads 6 formed on the circuit board 2 and the semiconductor chip is temporarily bonded to the circuit board 2 by virtue of the adhesive property of the flux 7 as shown in FIG. 10 (b). Thereafter, the circuit board with the semiconductor chip is put in a reflow furnace having a peak temperature of 200° C. to 250° C. such that the solder bumps 3 melt and then freeze in contact with the bonding pads 6, as shown in FIG. 10 (c). Finally, the flux residue is removed by the use of a solvent. In this way the semiconductor chip mounting is completed.

Materials of the circuit board to be subjected to the flip chip bonding process may include ceramic, glass, a printed wiring board, and a film board. In order to apply the technique to a variety of general-use apparatuses, use of the printed wiring board is most desirable in terms of cost reduction.

However, when the flip chip bonding is carried out to the printed wiring board, there is a problem that the printed wiring board itself is expanded or deformed by the heat of the reflow furnace in the course of solder reflow process of the solder bumps, due to which the printed wiring board tends to warp.

The warp of the printed wiring board occurs at a higher rate when the printed wiring board has a smaller thickness, and occurs more frequently particularly when the printed wiring board has a thickness of not greater than 0.5 mm.

When the warp of the printed wiring board occurs, the size of the gap between the semiconductor chip 1 and the printed wiring board 2 varies from position to position as shown in FIG. 11. As a result, there is disadvantageously produced a portion where the solder bump 3 does not reach the bonding pad 6 of the printed wiring board 2 to remain unconnected.

SUMMARY OF THE INVENTION

The object of the present invention is therefore to provide a semiconductor chip mounting method and apparatus capable of preventing a circuit board from warping in the reflow process of the solder bumps.

In order to achieve the aforementioned object, the present invention provides a semiconductor chip mounting method for mounting a semiconductor chip on a circuit board by a flip chip bonding method, comprising the steps of:

temporarily fixing said semiconductor chip onto said circuit board with solder bumps formed on a face of said semiconductor chip resting on bonding pads formed on a face of said circuit board;

holding with warp prevention means said circuit board, on which said semiconductor chip is temporarily fixed, such that the circuit board does not warp when heated at a temperature at which said solder bumps melt; and heating said circuit board which is held by said warp prevention means and on which said semiconductor chip is temporarily fixed such that said solder bumps melt and then freeze in contact with said bonding pads and thereby said semiconductor chip is connected with said circuit board.

According to the semiconductor chip mounting method of the present invention, the circuit board on which the semiconductor chip is temporarily fixed is held by the warp prevention means in the solder reflow process so as not to warp by heat. Accordingly, the circuit board does not warp when the circuit board is heated in the solder reflow process. As a result, all the solder bumps of the semiconductor chip are securely connected to the bonding pads of the circuit board. Thus, a remarkably high yield of flip chip bonding is achieved.

In one embodiment, the warp prevention means is composed of a jig to prevent the circuit board from warping by virtue of its own weight. The jig is placed on the face of the circuit board so as to surround the semiconductor chip. In this case, the possible warp of the circuit board can be easily suppressed by the weight of the jig per se.

In another embodiment, the warp prevention means is composed of magnet means and a jig associated with the magnet means. One of said magnet means and the jig is placed on the face of the circuit board so as to surround the semiconductor chip and the other of the magnet means and the jig is placed under the circuit board so that the magnet means and the jig hold the circuit board tight therebetween by a magnetic force of the magnet means attracting the jig toward the magnet means. In this case, the possible warp of the circuit board can be easily suppressed by the pressure between the magnet and the jig. Furthermore, since the magnet means and the jig are held on the circuit board by the magnetic force, they are not displaced by vibrations and/or tilting of the semiconductor chip caused when the circuit board with the semiconductor chip is transported or subjected to heat treatment for the reflow of the solder bumps.

In still another embodiment, the warp prevention means comprises a vacuum suction mechanism for drawing the circuit board rearward by vacuum suction and making a rear face of the circuit board adhere to support means such that the circuit board is flattened. In this case, there is no need to place any warp prevention jigs nor magnet means on the circuit board, which improves the operating efficiency in the solder reflow process.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The following describes several embodiments of the present invention with reference to the attached drawings. Note that like elements and parts are denoted by the same reference numbers throughout the figures.

First Embodiment

In the present embodiment, a warp prevention jig is placed on a printed wiring board in the solder reflow process when mounting a semiconductor chip on the printed wiring board by flip chip bonding.

Figure 1:
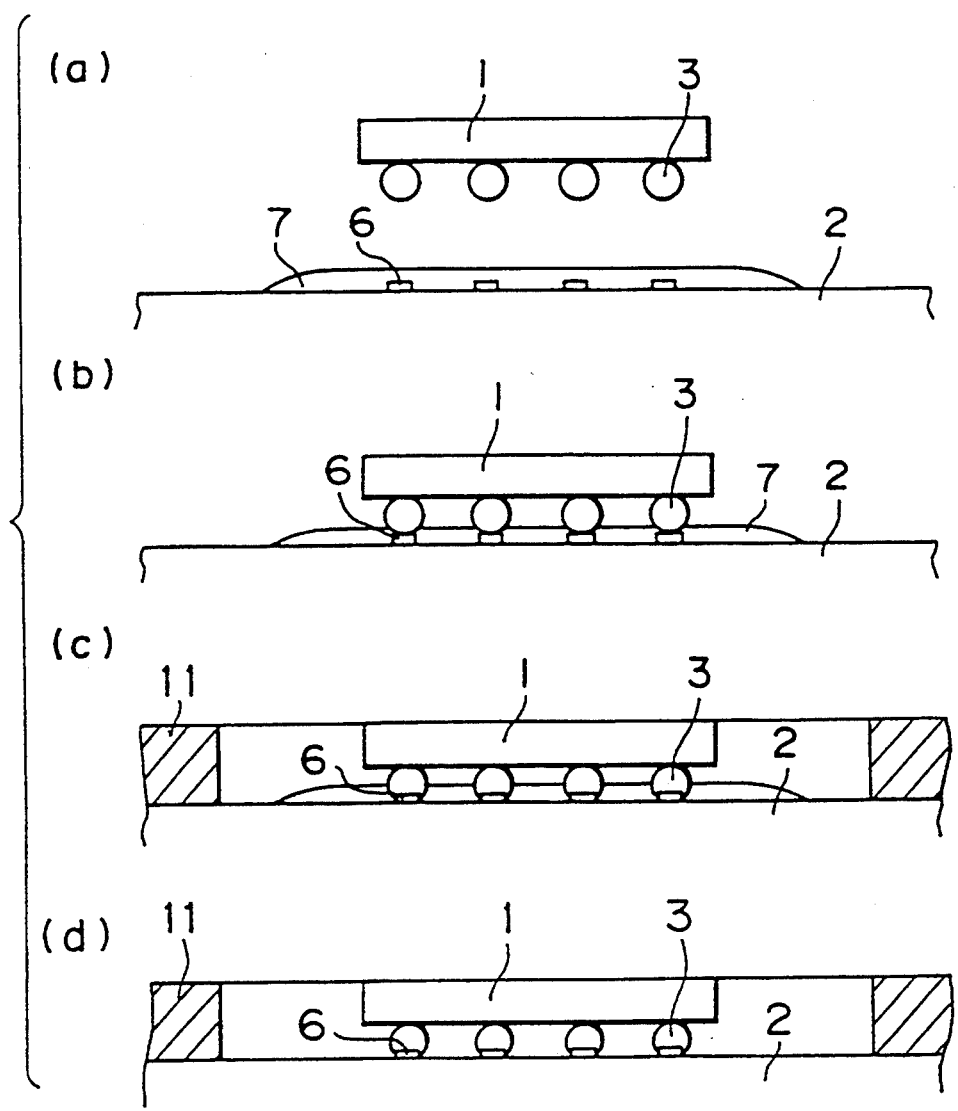
FIG. 1 illustrates a flow of a semiconductor chip mounting process to which the present invention is applied.

In the flip chip bonding process of the present embodiment shown in FIG. 1, firstly rosin flux 7 is applied onto a printed wiring board 2 such that bonding pads 6 formed on a face of the printed wiring board are covered with the flux 7 as shown in FIG. 1 (a). The printed wiring board 2 is constituted of a glass epoxy substrate of the grade of FR-4 and is approx. 0.25 mm thick. The bonding pad 6 is constituted of a 0.05 $\mu$m Au layer, a 2 $\mu$m Ni layer and a 18 $\mu$m Cu layer. The flux 7 applied has a thickness of approx. 30 $\mu$m.

Then a semiconductor chip 1 being a flip chip is placed on the printed wiring board 2, face down, so that solder bumps 3 on a face of the semiconductor chip 1 confront the corresponding bonding pads 6 on the printed wiring board 2. Then, the semiconductor chip 1 is pressed against the printed wiring board 2 and provisionally bonded to the printed wiring board 2 by virtue of the adhesive property of the flux 7, as shown in FIG. 1(b). In this embodiment, the semiconductor chip 1 is 9 mm square in size. The solder bump 6 is constituted of an alloy of tin (Sn) and lead (Pb) at a ratio of 60:40, and has a diameter of approx. 70 $\mu$m at its base and a height of approx. 80 $\mu$m. The solder bumps 6 are arrayed at a pitch of 160 $\mu$m.

Figure 10:
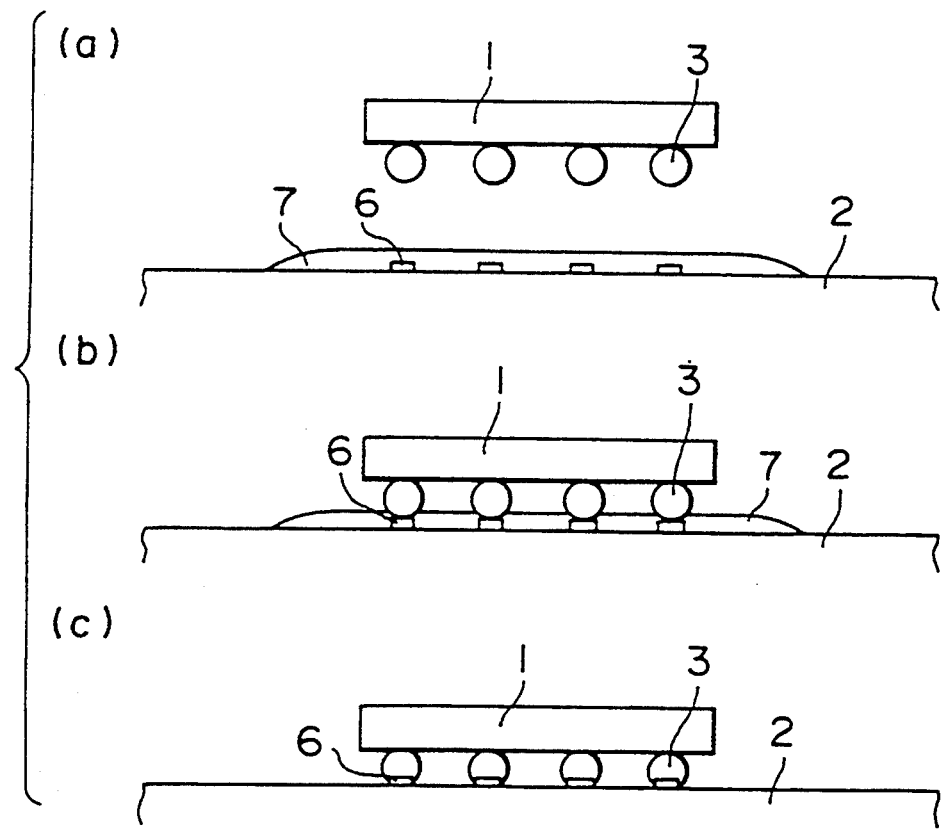
FIG. 10 illustrates a flow of a semiconductor chip mounting process using the prior art flip chip bonding.
Figure 11:
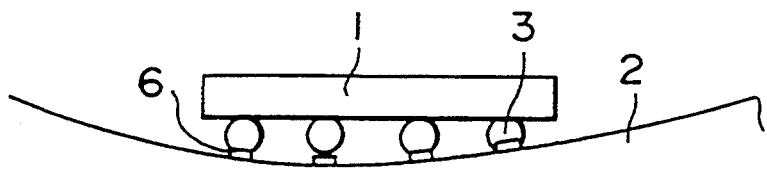
FIG. 11 illustrates a semiconductor chip bonded to a circuit board by the prior art flip chip bonding of FIG. 10, wherein the circuit board warps.

The two steps shown in FIG. 1 (a) and (b) are similar to the steps shown in FIG. 10 (a) and (b), and also are common to the other embodiments described later.

Figure 2:
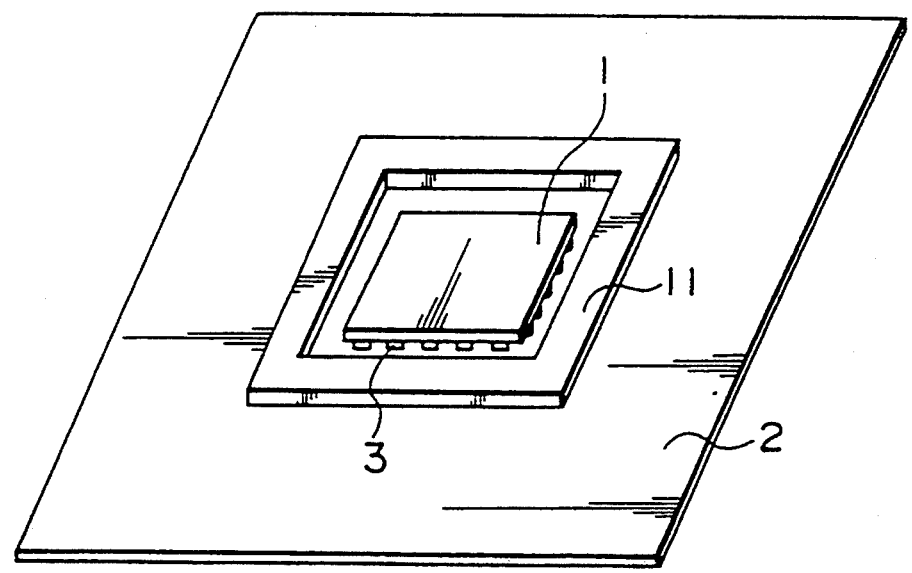
FIG. 2 illustrates a setup condition of a warp prevention jig used at a reflow step in the semiconductor chip mounting process to which the present invention is applied.

Then a warp prevention jig 11 made of stainless steel having a picture frame-like rectangular shape is placed on the printed wiring board 2 on which the semiconductor chip 1 is provisionally fixed, as shown in FIG. 1(c). The jig 11 surrounds the semiconductor chip 1 as shown in FIG. 2.

Then, the printed wiring board 2 with the semiconductor chip 1, around which the warp prevention jig 11, is placed on the printed wiring board 2 is put into a reflow furnace having a peak temperature of 250° C., so that the solder bumps 3 reflow, that is, melt and then freeze, to be connected with the bonding pads 6. Thus the semiconductor chip 1 is bonded to the printed wiring board 2 by soldering. The solder reflow process is carried out in the N$_2$ atmosphere. The possible warp of the printed wiring board 2 by heat is prevented by the weight of the warp prevention jig 11 itself during the solder reflow process. Because the printed wiring board 2 does not warp at all, satisfactory bonding of the semiconductor chip 1 to the printed wiring board 2 is achieved.

Finally the flux residue is removed by cleaning the soldered board and chip with a solvent, as shown in FIG. 1 (d). The cleaning process has a first step of dipping the soldered board and chip in acetone for 10 minutes, a second step of dipping the soldered board and chip in IPA (isopropyl alcohol) for two minutes and a third step of drying the cleaned object by placing it in an 60° C. oven for 5 minutes.

Figure 3:
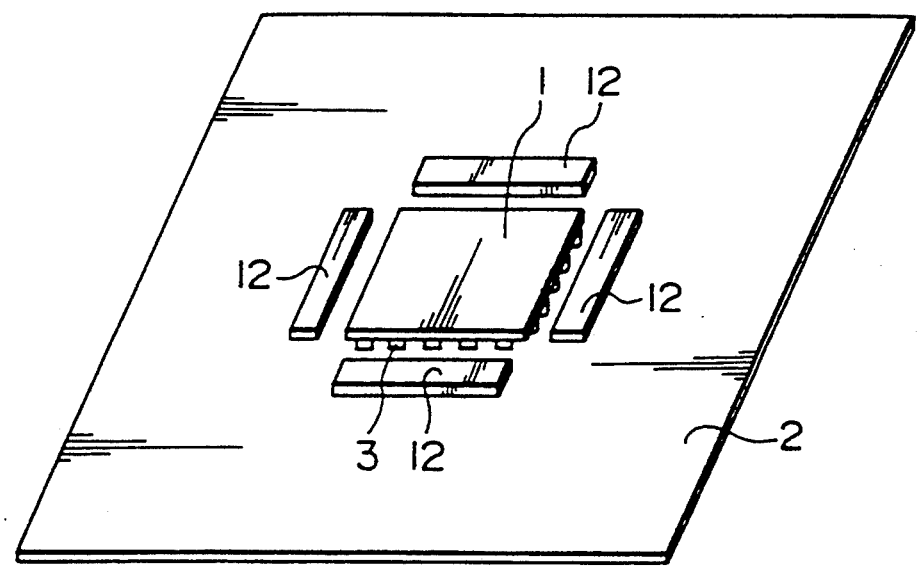
FIG. 3 illustrates a setup condition of another warp prevention jig used at a reflow step in the semiconductor chip mounting process to which the present invention is applied.

FIG. 3 is a perspective view of a variant of the warp prevention jig for preventing, by its own weight, the printed wiring board from warping during the solder reflow step. The warp prevention jig of FIG. 3 comprises four flat rectangular pieces, that is, strips 12 made of stainless steel. The strips 12 of the warp prevention jig are placed along each side of the semiconductor chip 1 temporarily fixed on the printed wiring board 2.

Figure 4A:
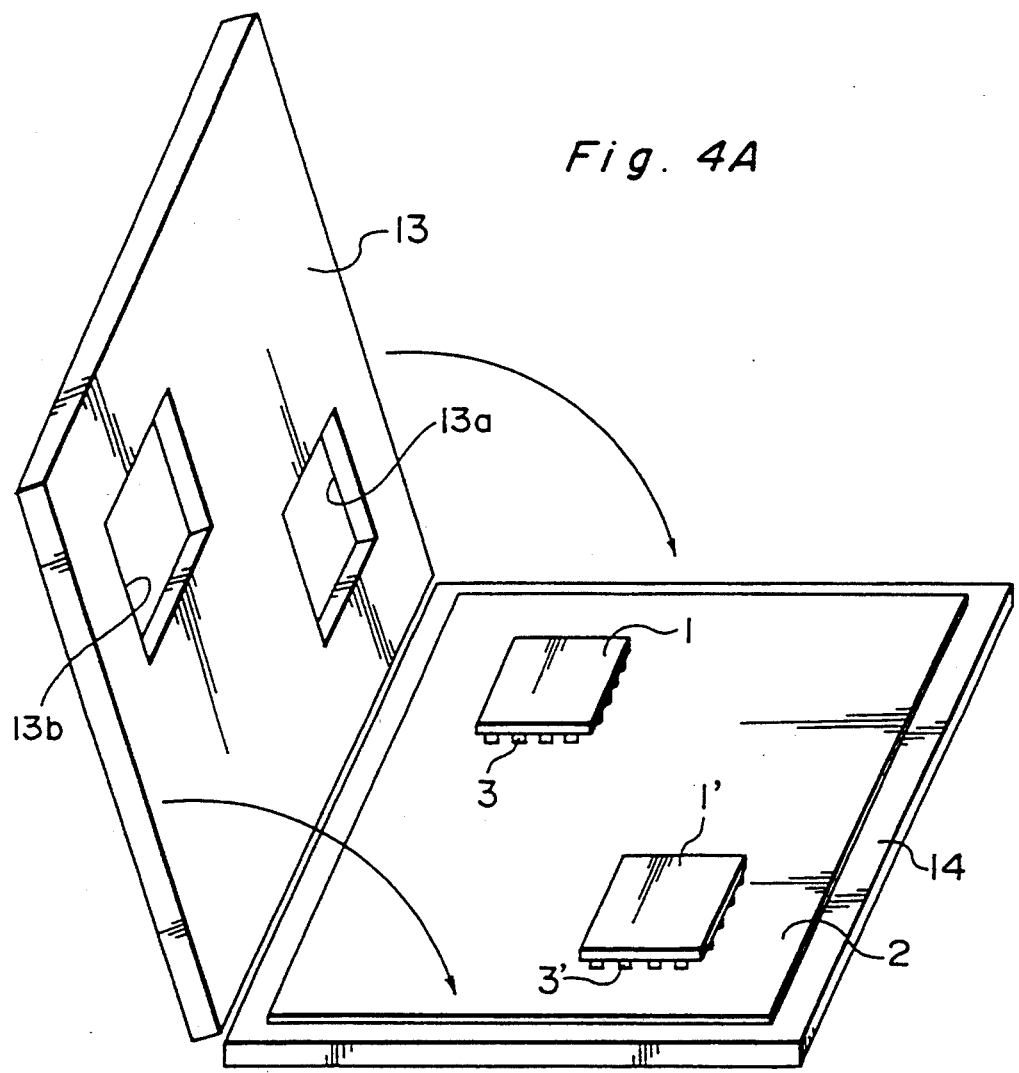
FIGS. 4A and 4B are explanatory views of a method of setting up a warp prevention jig different from the jigs shown in FIGS. 2 and 3.
Figure 4B:
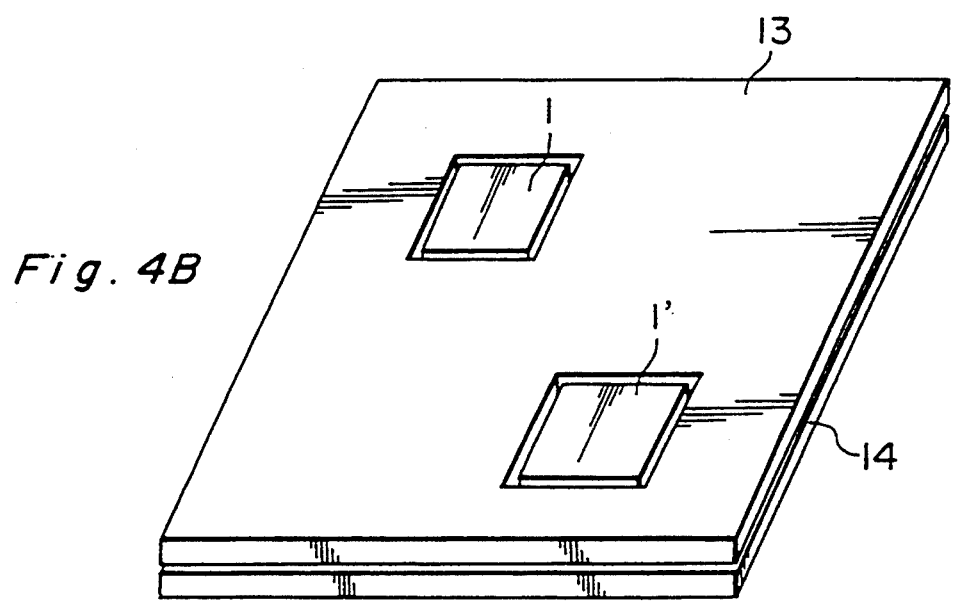

FIGS. 4A and 4B are perspective views of another variant of the warp prevention jig for use at the reflow step in order to prevent the warp of the printed wiring board from occurring by its own weight. The warp prevention jig is composed of two plate-shaped jig members each made of stainless steel, i.e., an upper warp prevention jig member 13 having holes 13a and 13b of such configurations as to surround semiconductor chips 1 and 1' temporarily fixed on the printed wiring board 2, and a lower warp prevention jig member 14 having no holes.

After placing the printed wiring board 2 on the lower warp prevention jig member 14 in a manner as shown in FIG. 4A, the upper warp prevention jig member 13 is placed on the printed wiring board 2 with the semiconductor chips 1 and 1' being received in the holes 13a and 13b as shown in FIG. 4B. As a result, the printed wiring board 2 is held between the two warp prevention jig members 13 and 14.

The strips 12 of the warp prevention jig shown in FIG. 3 and the warp prevention jig members 13 and 14 shown in FIGS. 4A and 4B well prevent the printed wiring board 2 from warping as the warp prevention jig 11 of FIG. 2 does when the board is put in the reflow furnace having a peak temperature of 250° C., thus leading to satisfactory bonding of the semiconductor chip 1 or chips 1, 1' to the printed wiring board 2.

In each of the examples described as above, when the solder reflow step is carried out during the flip chip bonding process, the warp prevention jig 11, 12, or 13 made of stainless steel is placed around the semiconductor chip 1 temporarily or provisionally fixed on the printed wiring board 2 by means of flux. With this arrangement, in the solder reflow process, the printed wiring board 2 is pressed by the weight of the warp prevention jig 11, 12, or 13 in a direction opposite to the direction in which the board 2 tends to warp by the heat treatment. Therefore, the printed wiring board 2 does not warp at all when the board is heated even to a peak temperature of about 250° C.

Although the warp prevention jigs 11, 12, 13, and 14 in the above examples are made of stainless steel, other materials can be used as far as they endure the reflow temperatures.

Second Embodiment

In the present embodiment, when mounting the semiconductor chip 1 on the printed wiring board 2 by the flip chip bonding method, the printed wiring board 2 is held between a magnet and an associated jig made of a material operating on the magnetic force of the magnet during the solder reflow process.

Prior to the solder reflow process, the semiconductor chip 1 is temporarily or provisionally fixed to the printed wiring board by virtue of the adhesive property of the flux 7 in the same manner as in the first embodiment (see FIG. 1 (a) and (b)).

Figure 5:
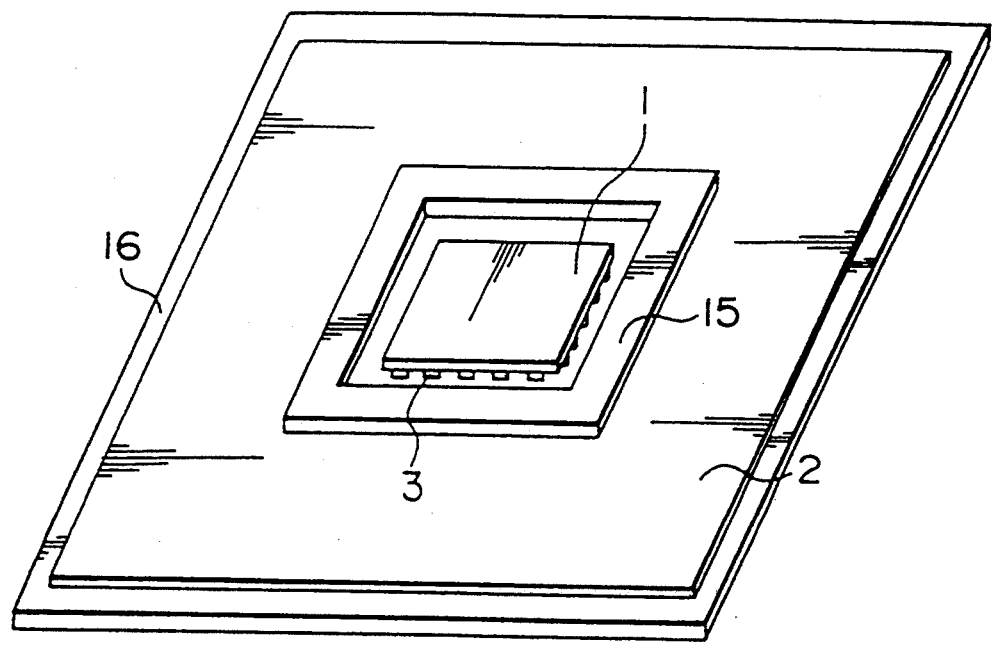
FIG. 5 illustrates a setup condition of a magnet of a configuration used at a reflow step in performing the semiconductor chip mounting method of the present invention.

As shown in FIG. 5, the printed wiring board 2 on which the semiconductor chip 1 is temporarily fixed is placed on a jig 16 made of stainless steel. Then an alnico (aluminum-nickel-cobalt alloy) magnet 15 having a picture frame-like rectangular shape is placed on the printed wiring board 2 so that the magnet 15 surrounds the semiconductor chip 1. The magnet 15 and the jig 16 are attracted toward each other by virtue of the magnetic force, so that the printed wiring board 2 is tightly held between the magnet 15 and the jig 16. The printed wiring board 2 with semiconductor chip held between the jig 16 and the magnet 15 is put into a reflow furnace having a peak temperature of 250° C. for the solder bumps 3 (see FIG. 1) of the semiconductor chip 1 to reflow and be connected with the bonding pads 6 (see FIG. 1) of the printed wiring board 2 so that the semiconductor chip 1 is bonded to the printed wiring board 2, and then the flux residue is removed by cleaning with solvent. The solder reflow process and the cleaning process of this embodiment may be carried out under the same conditions as the first embodiment.

According to this embodiment, since the printed wiring board 2 is held by virtue of the attraction force between the jig 16 and the magnet 15, the printed wiring board 2 does not warp and satisfactory bonding of the semiconductor chip 1 to the printed wiring board 2 is achieved.

The materials of the magnet 15 and the jig 16 are not limited to alnico and stainless steel, respectively, and other materials may be used as far as the magnet 15 and the jig 16 act on each other.

Figure 6:
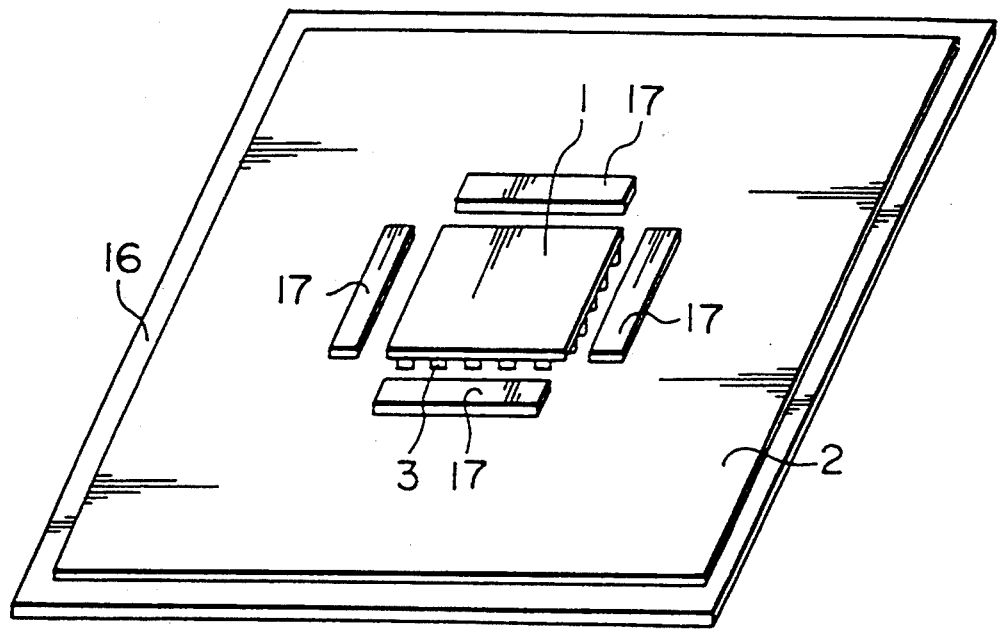
FIG. 6 illustrates a setup condition of a magnet of another configuration used at a reflow step in performing the semiconductor chip mounting method of the present invention.

FIG. 6 is a perspective view of a variant 17 of the magnet associated with the jig 16 made of stainless steel. The magnet 17 has a flat rectangular strip shape. In this case, four magnets 17 are used. The magnets 17 are placed on the printed wiring board 2 placed on the jig 16, along each side of the semiconductor chip 1. The magnets 17 and the jig 16 are attracted toward each other by virtue of the magnetic force, so that the printed wiring board 2 is tightly held between the magnets 17 and the jig 16. Thus portions of the printed wiring board 2 that are around the periphery of the semiconductor chip 1 are secured to the jig 16 by means of the four magnets 17.

Figure 7:
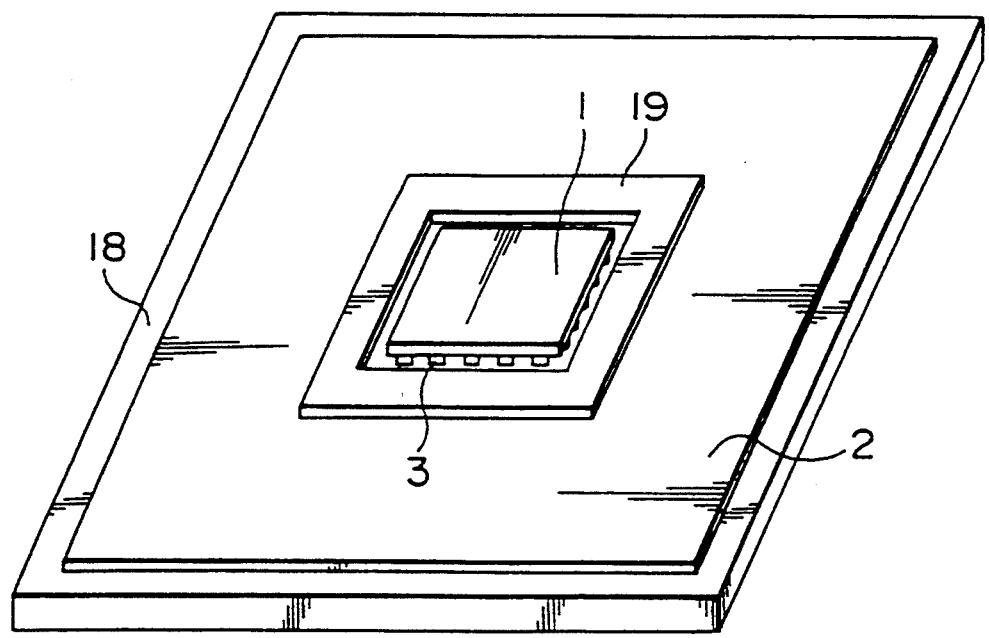
FIG. 7 illustrates a setup condition of a magnet of still another configuration used at a reflow step in performing the semiconductor chip mounting method of the present invention.

FIG. 7 is a perspective view of another variant 18 of the magnet and a variant 19 of the jig. The jig 19, made of stainless steel, has a picture frame-like rectangular shape. The magnet 18 has a plate-like shape and is almost the same in size as the printed wiring board 2. The printed wiring board 2 with the semiconductor chip 1 temporarily fixed thereto is placed on the magnet 18, and the jig 19 is placed on the printed wiring board 2 in such a manner to surround the semiconductor chip 1. The jig 19 is attracted toward the magnet 18 by the magnetic force, so that the printed wiring board 2 is held tight between the jig 19 and the magnet 18 at portions around the periphery of the semiconductor chip 1 by the attraction force exerted between the magnet 18 and the jig 19.

Use of the associated magnets 17 and jig 16 shown in FIG. 6 or the associated magnet 18 and jig 19 shown in FIG. 7 prevents the printed wiring board 2 from warping when the printed wiring board 2 with the semiconductor chip 1 is put into the reflow furnace having a peak temperature of 250° C. to be subjected to the solder reflow process. Accordingly, a satisfactory bonding is achieved.

In the present embodiment described as above, the printed wiring board 2 is secured to the stainless steel jig 16 (19) at portions of the printed Wiring board 2 around the periphery of the semiconductor chip 1 by means of the magnet or magnets 15 (17, 18) during the solder reflow process. Accordingly, the printed wiring board 2 does not warp at all when the board 2 is heated to a peak temperature of around 250° C.

Since the above-mentioned magnet 15 (17, 18) and the jig 16 (19) are fixed to each other by virtue of the magnetic force with interposition of the printed wiring board 2 therebetween, the magnet and the jig are not displaced from their original positions even if the printed wiring board 2 inclines or vibrates at the time of transportation and/or solder reflow process. This enables an easy handling of the printed wiring board sandwiched between the magnet and jig at the time of transportation and/or solder reflow process.

Third Embodiment

In the present embodiment, a printed wiring board 2, to which a semiconductor chip 1 is bonded by the flip chip bonding method, is flattened by vacuum suction in the solder reflow process.

Prior to the solder reflow process, the semiconductor chip 1 is temporarily or provisionally fixed to the printed wiring board by virtue of the adhesive property of the flux 7 in the same manner as in the first embodiment (see FIG. 1 (a) and (b)).

Figure 8:
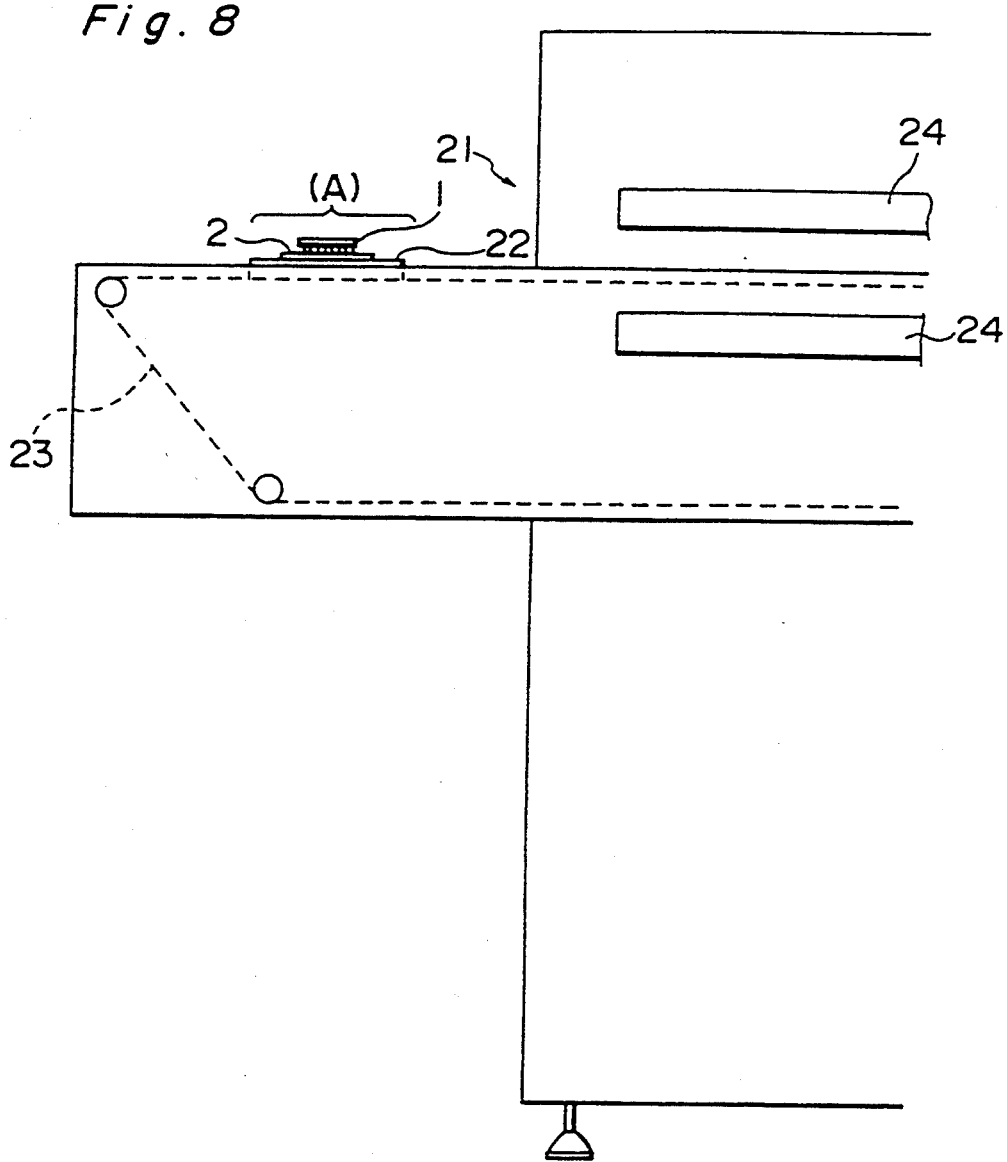
FIG. 8 is a schematic sectional view of a belt furnace for use at a reflow step in performing the semiconductor chip mounting method of the present invention.

FIG. 8 is a schematic view of a belt furnace for use in carrying out the solder reflow process.

The printed wiring board 2, on which the semiconductor chip 1 is temporarily fixed by virtue of the adhesive property of the rosin flux 7, is fixed by vacuum suction to a vacuum suction jig 22 provided with a vacuum suction mechanism, and placed on a belt conveyer 23 of the belt furnace 21 through the vacuum suction jig 22.

Figure 9:
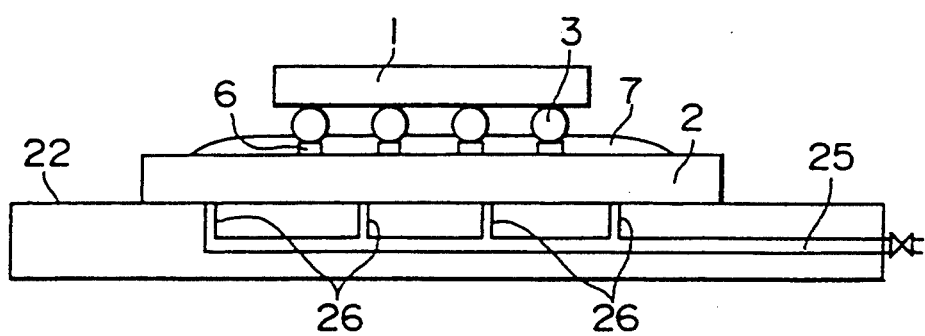
FIG. 9 is an enlarged view of the portion (A) of FIG. 8.

FIG. 9 is an enlarged view of the portion (A) in FIG. 8. The semiconductor chip 1 is temporarily fixed onto the printed wiring board 2 by means of the flux 7 with solder bumps 3 of the semiconductor chip 1 resting on the corresponding bonding pads 6 of the printed wiring board 2. Then, the printed wiring board 2 with the semiconductor chip 1 is placed on a surface of the vacuum suction jig 22 such that the printed wiring board 2 closes a plurality of suction openings 26 opened at the surface of the vacuum suction jig 22.

Then by drawing a vacuum through a vacuum path 25 communicated with the suction openings 26 by means of a vacuum pump (not shown), the printed wiring board 2 is drawn downwards, that is, rearward and its rear face is adhered tight to the surface of the vacuum suction jig 22.

The printed wiring board 2 held on the vacuum suction jig 22 by vacuum suction and placed on the conveyer 23 is introduced into the belt furnace 21 by the movement of the conveyer 23 and then heated by heaters 24 at temperatures up to max. 250° C. in the $N_2$ atmosphere. Through this solder reflow process, the solder bumps 3 are melted and connected or bonded to the bonding pads 6 so that the semiconductor chip 1 is bonded to the printed wiring board 2.

After completing the solder reflow process in the belt furnace 21, flux cleaning is performed to remove the flux residue from the printed wiring board 2 in a manner as described above in connection with the first embodiment. As a result, the printed wiring board 2 does not warp at all and satisfactory flip chip bonding is achieved.

As described above, the printed wiring board 2 is held by vacuum suction on the vacuum suction jig 22 during the solder reflow process so as to be flattened. Accordingly, the printed wiring board 2 does not warp at all when the board is heated even to a peak temperature of 250° C.

Although the printed wiring board 2, on which the semiconductor chip 1 is temporarily fixed, is secured by vacuum suction onto the vacuum suction jig 22 provided with a vacuum suction mechanism in the example of FIGS. 8 and 9, the present invention is not limited to the above-mentioned arrangement. For example, the reflow apparatus per se represented by the belt furnace 21 may be provided with a vacuum suction mechanism.

Although one or two semiconductor chips 1, 1' are mounted on the printed wiring board 2 in each of the aforementioned embodiments, the present invention can be of course applied to the case where a plurality of semiconductor chips are mounted on the printed wiring board 2 to form a multi-chip module.

Although the printed wiring board 2 is used as a circuit board for receiving the semiconductor chip 1 in each of the aforementioned embodiments, the present invention can be applied to any circuit board such as a film board which easily warps in the solder reflow process.

Materials other than those specified herein may be also used for the warp prevention jigs, magnets, bonding pads, bumps, flux, etc.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor chip mounting method for mounting a semiconductor chip on a circuit board, wherein solder bumps formed on a face of the semiconductor chip are made to melt and freeze in contact with bonding pads formed on the circuit board in a solder reflow process so that the semiconductor chip is connected with the circuit board, comprising the steps of:
   contacting said circuit board with a surface; and
   applying external force to said circuit board in a direction opposite to a warp direction in which the circuit board tends to warp during the solder reflow process, so as to prevent the circuit board from warping.

2. A semiconductor chip mounting method for mounting a semiconductor chip on a circuit board, comprising the steps of:
   supporting said circuit board on a surface;
   placing solder bumps formed on a face of said semiconductor chip on bonding pads formed on a face of said circuit board;
   applying external force to said circuit board to prevent a portion of said circuit board where said bonding pads are formed from warping when said circuit board is heated at a melting temperature of said solder bumps;
   heating said semiconductor chip and said circuit board at least at said melting temperature of said solder bumps; and
   releasing said circuit board from said external force.

3. The semiconductor chip mounting method of claim 2, wherein said step for applying external force to said circuit board further comprises the substeps of:
   placing a jig on the face of said circuit board so as to surround said semiconductor chip by said jig, to prevent said circuit board from warping by applying the weight of said jig to the circuit board.

4. The semiconductor chip mounting method of claim 3, wherein said step for placing a jig on the face of said circuit board further comprises the substep of:
   placing a picture frame-like shaped jig on said circuit board so as to surround said semiconductor.

5. The semiconductor chip mounting method of claim 3, wherein said step for placing a jig on the face of said circuit board further comprises the substep of:
   placing strip shaped jig along sides of said semiconductor chip.

6. The semiconductor chip mounting method of claim 3, wherein said step for placing a jig on the surface of said circuit board further comprises the substep of:
   placing a first plate-shaped jig member having a hole for receiving said semiconductor chip and a second plate-shaped jig member, said first and second plate-shaped jig members sandwiching said circuit board therebetween.

7. The semiconductor chip mounting method of claim 2, wherein said step for applying external force to said circuit board further comprises the substeps of;
   placing one of a magnet and a jig on the face of said circuit board so as to surround said semiconductor chip; and
   placing the other of said magnet and said jig under said circuit board so that said magnet and said jig hold said circuit board therebetween by a magnetic force of said magnet attracting said jig toward said magnet.

8. The semiconductor chip mounting method of claim 7, wherein said step for placing one of a magnet and a jig on the face of said circuit board further comprises the substep of:
   utilizing a magnet made of alnico.

9. The semiconductor chip mounting method of claim 7, wherein said step for placing one of a magnet and a jig on the face of said circuit board further comprises the substep of:
   utilizing a jig made of stainless steel.

10. The semiconductor chip mounting method of claim 7, wherein said step for placing one of a magnet and a jig on the face of said circuit board further comprises the substep of:
   placing a picture frame-shaped magnet on the face of said circuit board so as to surround said semiconductor chip.

11. The semiconductor chip mounting method of claim 7, wherein said step for placing one of a magnet and a jig on the face of said circuit board further comprises the substep of:
   placing strip-shaped magnets on the face of said circuit board along sides of said semiconductor chip.

12. The semiconductor chip mounting method of claim 7, wherein said step for placing one of a magnet and a jig on the face of said circuit board further comprises the substep of:
   placing a picture frame-shaped jig on the face of said circuit board so as to surround said semiconductor chip.

13. The semiconductor chip mounting method of claim 2, wherein, said surface comprises a vacuum suction device thereon; and
   said step for applying external force to said circuit board further comprises the substep of;
   drawing said circuit board toward said surface by vacuum suction caused by said vacuum suction device to adhere a face of said circuit board to said surface so as to flatten said circuit board.

14. A semiconductor chip mounting method for mounting a semiconductor chip on a circuit board by a flip chip bonding method, comprising the steps of:
   placing said circuit board on a surface;
   placing said semiconductor chip onto said circuit board with solder bumps formed on a face of said semiconductor chip resting on bonding pads formed on a face of said circuit board;
   placing warp prevention means, for applying external force to said circuit board, on said circuit board, on which said semiconductor chip is placed, to hold said circuit board such that the circuit board does not warp when heated at a temperature at which said solder bumps melt; and
   heating said circuit board which is held by said warp prevention means and on which said semiconductor chip is placed such that said solder bumps melt and then freeze in contact with said bonding pads and thereby said semiconductor chip is connected with said circuit board.

* * * * *